US006964004B2

United States Patent
Chatterjee et al.

(10) Patent No.: US 6,964,004 B2
(45) Date of Patent: Nov. 8, 2005

(54) METHOD AND APPARATUS FOR TESTING A SYSTEM-ON-A-CHIP

(75) Inventors: Abhijit Chatterjee, Atlanta, GA (US); Dave Majernik, Mt. Airy, MD (US); Sasikumar Cherubal, Tucson, AZ (US); Sudip Chakrabarti, San Jose, CA (US); Ramakrishna Voorakaranam, Phoenix, AZ (US); Jacob A. Abraham, Austin, TX (US); Douglas Goodman, Tucson, AZ (US)

(73) Assignee: Ardext Technologies, Inc., Tucson, AZ (US)

( * ) Notice: Subject to any disclaimer, the term of this patent is extended or adjusted under 35 U.S.C. 154(b) by 405 days.

(21) Appl. No.: 10/280,543

(22) Filed: Oct. 24, 2002

(65) Prior Publication Data

US 2003/0158688 A1 Aug. 21, 2003

Related U.S. Application Data

(60) Provisional application No. 60/343,026, filed on Oct. 24, 2001.

(51) Int. Cl.[7] .............................................. G01R 31/28
(52) U.S. Cl. ...................................... 714/732; 714/733
(58) Field of Search ............................. 324/158.1, 763; 710/72; 455/456.4, 456.2; 716/5; 714/732, 733

(56) References Cited

U.S. PATENT DOCUMENTS

| | | | | |
|---|---|---|---|---|
| 5,051,996 A | * | 9/1991 | Bergeson et al. | ........... 714/732 |
| 5,387,862 A | * | 2/1995 | Parker et al. | ............. 324/158.1 |
| 6,115,763 A | * | 9/2000 | Douskey et al. | ............... 710/72 |
| 6,256,506 B1 | * | 7/2001 | Alexander et al. | ........ 455/456.4 |
| 6,259,924 B1 | * | 7/2001 | Alexander et al. | ........ 455/456.2 |
| 6,571,373 B1 | * | 5/2003 | Devins et al. | .................. 716/5 |
| 6,771,087 B1 | * | 8/2004 | Oz et al. | ..................... 324/763 |

OTHER PUBLICATIONS

Pramodchandran N. Variyam, et al, "Specification–Driven Test Design for Analog Circuits," International Symposium on Defect and Fault Tolerance in VLSI Systems, 1999, pp. 335–340.

Pramodchandran N. Variyam and Abhijit Chatterjee, "Enhancing Test Effectiveness for Analog Circuits Using Synthesized Measurements," Proceedings, VLSI Test Symposium, pp. 132–137, 1998.

Terry Wilson, "Test Challenges of Next–Generation RF Digital Devices," EE Evaluation Engineering, vol. 39, No. 11, 2000, pp. 31–37.

* cited by examiner

*Primary Examiner*—David Ton
(74) *Attorney, Agent, or Firm*—Birdwell & Janke, LLP

(57) ABSTRACT

A method for testing a system on a chip or a system on a package (""SOPC") having a plurality of internal modules that are tested to determine whether predetermined performance specifications are satisfied. A first module of the SOPC is selected for testing. A determination is made as to whether the first module is directly accessible or not. If the first module is directly accessible, the module may be tested with automated test equipment external to the SOPC. If the first module is not directly accessible, the module may be tested with a second and third module of the SOPC.

5 Claims, 3 Drawing Sheets

METHOD AND APPARATUS FOR TESTING A SYSTEM-ON-A-CHIP

This application claims the benefit of the provisional application Ser. No. 60/343,026, filed Oct. 24, 2001, entitled Method for Testing Embedded Analog Circuits in Systems-on-Chips (SoC) using Implicit Specification Tests, which is incorporated by reference in its entirety.

FIELD OF INVENTION

This invention relates to testing of integrated circuits. More particularly, the invention relates to a method and apparatus for testing a system-on-a-chip ("SOC").

BACKGROUND OF INVENTION

In the past, an individual integrated circuit ("IC") would be manufactured for a circuit that performs a specific function. Such circuits are sometimes referred to as "modules." For example, a module may be a radio frequency ("RF") circuit, such as a low-noise amplifier or power amplifier, an analog circuit, such as a filter, a mixed-signal circuit, such as an analog-to-digital converter ("ADC") or a digital-to-analog converter ("DAC"), or a digital circuit, such as a microprocessor, as well as circuits that perform other functions. Various different types of test processes have been developed for testing ICs that contain a single module.

Traditionally, RF, analog, and mixed-signal circuits are tested by applying a test stimulus and verifying that the functional specifications for the circuit are satisfied. Functional specifications are parameters such as common-mode rejection ratio, power supply rejection ratio, signal-to-noise ratio, integral nonlinearity, differential nonlinearity, and other similar metrics. This method is referred to as "specification testing." The traditional specification testing is time consuming and faster methods have been sought. Two such faster test methods are described below.

U.S. patent application Ser. No. 09/837,887, now pending, to Voorakaranam, et al., entitled Method and Apparatus for Low Cost Signature Testing of Analog and RF Circuits, incorporated herein in its entirety by reference, discloses a method for testing analog circuits. In the Voorakaranam method, a sample of ICs is tested using the traditional specification testing method. In addition, IC specification and design information are used to derive test stimuli that will produce a set of synthesized measurements. The sample ICs are retested using the derived test stimuli. The measurements obtained from the retesting are related to the IC specifications through nonlinear regression mapping resulting in a set of synthesized test measurements. A pass/fail decision i.e., whether the tested IC is "good" or "bad," is made on the basis of the synthesized test measurements. An advantage of this method is that direct measurements of the IC specifications is not required. Because the synthesized test measurements are mapped into the IC specifications using nonlinear regression mapping, the synthesized test measurements implicitly contain the IC specifications. U.S. patent application Ser. No. 09/838,359 now U.S. Pat. No. 6,476,741, to Cherubal, et al., entitled Method and System for Making Optimal Estimates of Linearity Metrics of Analog-to-Digital Converters, incorporated herein in its entirety by reference, discloses a method for testing analog-to-digital converter circuits. The Voorakaranam and Cherubal methods are referred to herein as the "implicit specification testing" or "signature testing" method.

With the ability to manufacture ICs that have many more transistors than was possible in the past, it is now possible to manufacture an SOC on a single IC and also to manufacture a system-on-a-package ("SOP"). An SOP refers to two of more ICs that have been bonded together in a single package. For the purposes of this disclosure, the term "system-on-a-package-or-a-chip" ("SOPC") will be used herein to refer to both SOC and SOP. Typically, an SOPC includes a number of modules ("embedded modules"). Use of the traditional specification testing method to test an SOPC is even more time consuming than with an IC having a single module. Further, it may not be possible to test an SOPC using specification based testing methods. For these reasons, it would be desirable to employ the implicit specification testing methods to test modules of an SOPC.

BRIEF SUMMARY OF THE INVENTION

A method for testing a system on a chip or a system on a package ("SOPC") having a plurality of internal modules. The modules are tested to determine whether predetermined performance specifications for the module are satisfied. According to one preferred embodiment, a first module of the SOPC is selected for testing. A determination is made as to whether the first module is directly accessible or not. If the first module is directly accessible, the module may be tested with automated test equipment external to the SOPC. Selected pins of the SOPC are stimulated with one or more test stimuli so as to produce an implicit test signature. The automated test equipment determines the test signature. If the first module is not directly accessible, the module may be tested with a second and third module of the SOPC. The second module stimulates the first module. The third module determines the test signature. In one preferred embodiment, the second and third module may be the same module.

DETAILED DESCRIPTION OF A PREFERRED EMBODIMENT

The invention is directed to a method and apparatus for testing an SOPC. In one preferred embodiment, directly accessible and indirectly accessible modules of the SOPC are identified. The directly accessible modules are tested using automated test equipment ("ATE"). The ATE generates a test stimulus and extracts a test signature for each module tested using the aforementioned implicit specification testing method.

The indirectly accessible modules are tested using modules of the IC. One of more modules of the IC generate a test stimulus and extract a test signature for used for each module tested using the aforementioned implicit specification testing method. The on-chip module that generates the test stimulus may be a programmable hardware module that runs test stimulus generator software. Alternatively, the on-chip module that generates the test stimulus may be a hardware module that generates a predetermined test stimulus. The on-chip module that extracts the signature test specification may be a programmable hardware module that runs test specification extractor software. Alternatively, the on-chip module that captures the signature test specification may be a hardware module that computes a signature test specification from the test response.

In another alternative embodiment, both the test stimulus and the test response can be routed between the ATE and module under test using embedded on-chip design-for-test ("DFT") hardware. As one skilled in the art will appreciated, DFT hardware includes circuitry and buses that allow external access to embedded modules by the ATE.

As is known in the art and used herein, an SOPC is one or more integrated circuits sealed in an IC package from which pins extend for input and output to the IC where removal of the IC from the package without damaging or destroying the IC is impractical. Therefore, it is impractical to probe internal parts of the SOPC. Further, it may be impractical to probe internal parts of an SOPC because the geometric features, such as circuit traces and test nodes, are smaller than available probes.

As used herein, a directly accessible module is a module in which the inputs and outputs of the module can be directly accessed by the pins which extend from the SOPC package. A module is not directly accessible (also referred to as "indirectly accessible") if the inputs and outputs of the module can not be directly accessed by the pins which extend from the SOPC package.

As previously mentioned, a circuit that performs a specific function is sometimes referred to as a "module." It will be appreciated that the present invention may be practiced with a module that performs more than a single function or in which the function performed by the module may be divided into sub-functions.

Figure 1:
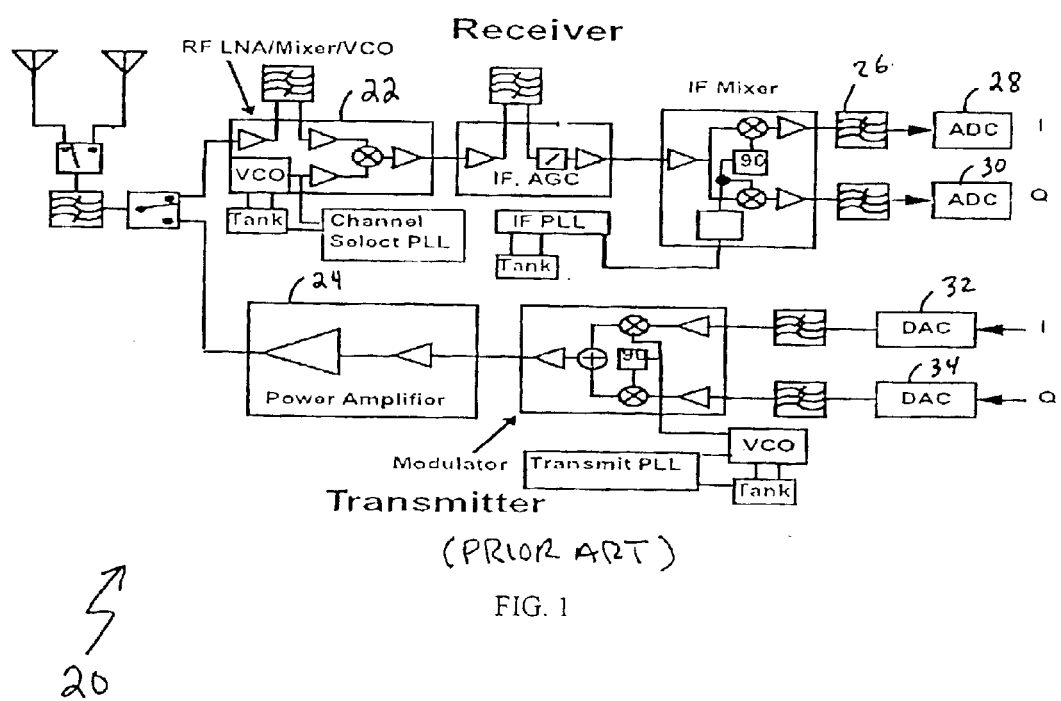
FIG. 1 illustrates a block diagram of an RF system-on-a-package-or-a-chip.

Referring to FIG. 1, a block diagram of a typical RF SOPC 20 that may be tested using the present invention is shown. As indicated in FIG. 1, the SOPC 20 includes RF, analog, and mixed-signal modules. Low noise amplifier 22 and power amplifier 24 are RF modules. Filter 26 is an analog module. ADCs 28, 30 and DACs 32, 34 are mixed-signal modules. The shown modules may be directly or indirectly accessible.

Figure 2:
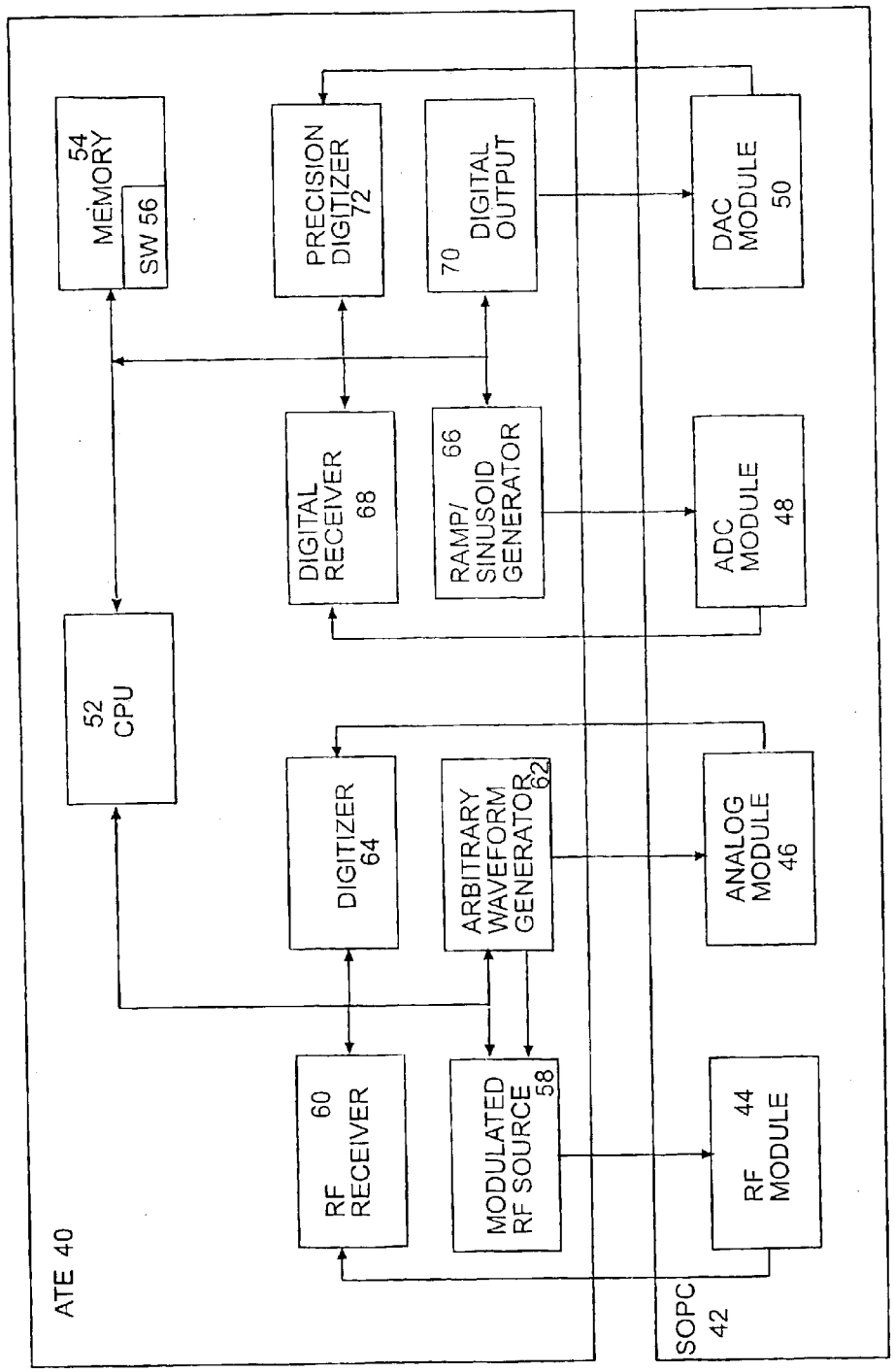
FIG. 2 illustrates a block diagram of automatic test equipment and a system-on-a-package-or-a-chip according to the present invention.

Referring to FIG. 2, a block diagram of an ATE 40 and an SOPC 42 that may be tested using the present invention are shown. The SOPC 42 includes an RF module 44, an analog module 46, an ADC module 48, and a DAC module 50. Modules 44, 46, 48, and 50 are directly accessible by the ATE 40 through external pins on the SOPC 42. In addition, each of the modules is subject to pass/fail testing by the ATE 40. The ATE 40 has a CPU 52 and a memory 54 for storing implicit specification testing software 56. In addition, the ATE 40 has additional functional blocks for generating test stimuli and receiving test responses that are more fully described below. The CPU 52 is communicatively coupled to the memory 54 and each of the functional blocks as shown in FIG. 2. The implicit specification testing software, when run on the ATE 40, generates test stimuli that will produce a set of synthesized measurements and extract a signature test specification from a test result using the implicit specification testing method. The extracted signature test signature is used make a pass/fail decision for the module being tested.

In a test of the RF module 44, the ATE 40 uses its modulated RF source 58, RF receiver 60, and its arbitrary waveform generator ("ARB") 62. The CPU 52 provides test stimulus parameters to the ARB 62. The output from the ARB 62 is presented to the modulated RF source 58 where it is modulated onto an RF signal. The output from the modulated RF source 58 is presented to the RF module 44 and the resulting output (i.e., the test response) is sampled by the RF receiver 60. The RF receiver 60 demodulates the test response and the CPU 52 samples the demodulated test response. Using implicit specification testing software 56, the CPU 52 extracts a signature test specification. The signature test specification is used to make a pass/fail decision for the modulated RF source 58.

In a test of the analog module 46, the ATE 40 uses its ARB 62 and digitizer 64. Test stimuli formulated by the implicit specification testing software 56 are presented to the analog module 46 by the ARB 62. The test response is sampled by the digitizer 64. Using the implicit specification testing software 56, the CPU 52 extracts a signature test specification. The signature test specification is used to make a pass/fail decision for the analog module 46.

In a test of the ADC module 48, the ATE 40 uses its ramp/sinusoid generator 66 and digital receiver 68. Test stimuli formulated by the implicit specification testing software 56 are presented to the ADC module 48 by the ramp/sinusoid generator 66. The test response is sampled by the digital receiver 68. Using the implicit specification testing software 56, the CPU 52 extracts a signature test specification. The signature test specification is used to make a pass/fail decision for the ADC module 48.

In a test of the DAC module 50, the ATE 40 uses its digital output 70 and precision digitizer 72. Test stimuli formulated by the implicit specification testing software 56 are presented to the DAC module 50 by the digital output 70. The test response is sampled by the precision digitizer 72. Using the implicit specification testing software 56, the CPU 52 extracts a signature test specification. The signature test specification is used to make a pass/fail decision for the DAC module 50.

Figure 3:
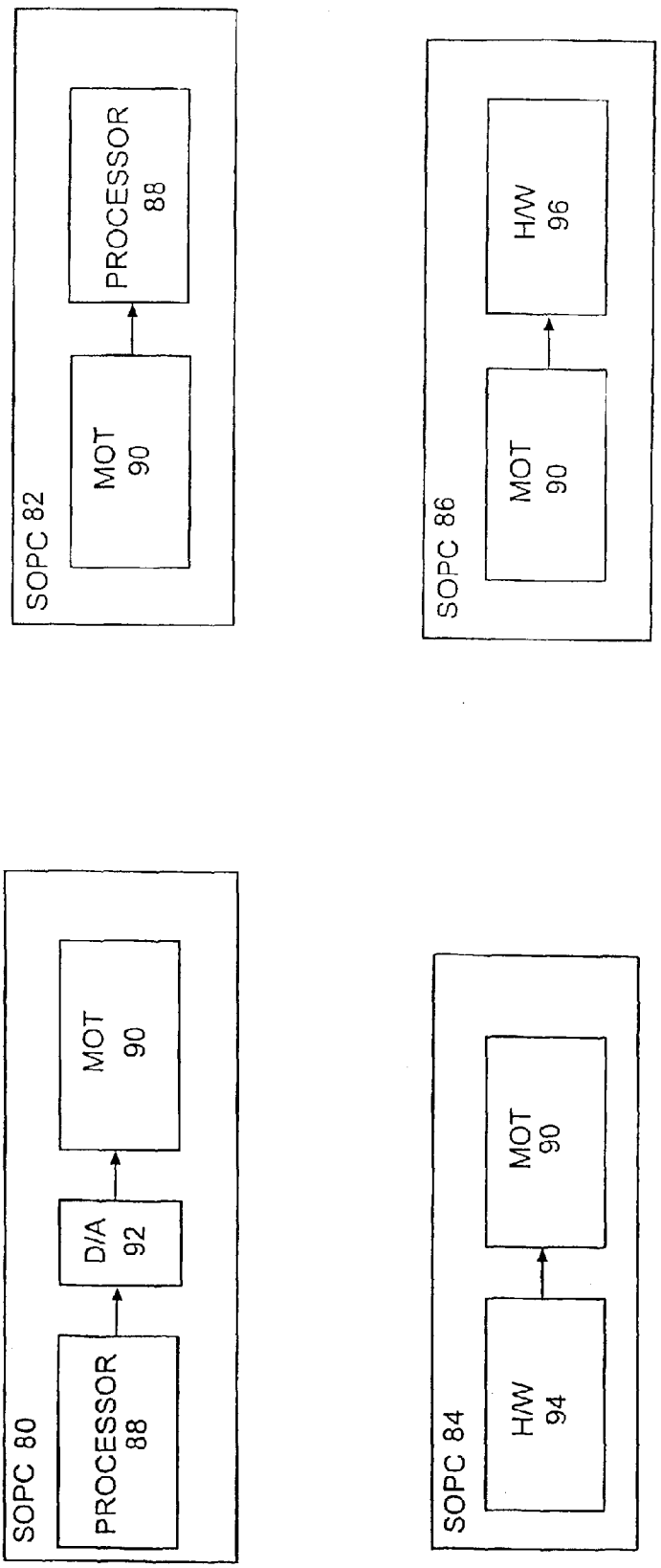
FIG. 3 illustrates block diagrams of alternative embodiments of a system-on-a-package-or-a-chip according to the present invention.

Referring to FIG. 3, SOPCs are shown that have modules that are not directly accessible but which may be tested according to the present invention. FIG. 3 shows exemplary SOPCs 80, 82, 84, and 86. In the shown SOPCs like modules and blocks are shown with the same name and reference number. A module-under-test ("MOT") 90 may be any RF, analog, or mixed-signal circuit.

In SOPC 80, test stimuli are generated by software running on processor 88. This software is referred to as embedded software test stimulus generator or ESTG. The test stimuli output from processor 88 is converted to an analog stimulus by digital-to-analog converter 92 and input to MOT 90.

In SOPC 84, test stimuli are generated by embedded hardware module 94. This hardware module is referred to as embedded hardware test stimulus generator or EHTG. The test stimuli output from hardware module 94 is an analog stimulus or may be converted to an analog stimulus by digital-to-analog converter (not shown) and is input to MOT 90.

In SOPC 82, a test response output from MOT 90 is sampled by software running on processor 88. The software computes values of a prescribed set of test specifications. Additionally, the software evaluates the polynomial functions of its inputs and generates the specification values from the results of the polynomial evaluations. This software is referred to as embedded software specification extractor or ESSE.

In SOPC 86, a test response output from MOT 90 is sampled by hardware module 96. The hardware module 96 computes the specifications of MOT 90 from the test response. The hardware module 96 preferably includes an arithmetic logic unit and a controller. This hardware module 96 is referred to as embedded hardware specification extractor or EHSE.

The ESTG, EHTG, ESSE, and the EHSE incorporate the principals of the aforementioned implicit specification testing method. In FIG. 3, the processor 88 in SOPC 80 and the processor 88 in SOPC 82 may be the same processor in a single SOPC. In addition, the hardware module 94 in SOPC 84 and the hardware module 96 may be the same hardware module in a single SOPC, provided any such combined hardware module performs all of the functions that each performs separately. It will be appreciated that a single SOPC may have a processor 88 and hardware module 94 or 96. Further, it will be appreciated that other hardware and software combinations are possible.

The operations of the ESTG, EHTG, ESSE, and the EHSE are coordinated and controlled by a system-on-a-chip test controller or SoCIT. In one preferred embodiment, the SoCIT is software running on processors 88. In an alternative preferred embodiment, the SoCIT is hardware embodied in hardware module 94, 96, or in a separate dedicated hardware module. In additional embodiments, the SoCIT is software running on an ATE or is a hardware module implemented on an ATE.

Using the aforementioned method and apparatus, system level specifications may be predicted by testing each module of the SOPC under test. In this way, the SOPC under test may be evaluated as "good" or "bad." In addition, system level specifications may also be predicted from test response measurements made on internal circuit nodes. The implicit specification method is employed to sample test responses on internal circuit nodes and is used to identify system-level input stimuli that expose manufacturing variations that affect the SOPC's system-level specifications. Test stimuli are generated and specifications are extracted by an on-chip processor or hardware module, or by an off-chip ATE.

The terms and expressions that have been employed in the foregoing specification are used as terms of description and not of limitation, and are not intended to exclude equivalents of the features shown and described or portions of them. The scope of the invention is defined and limited only by the claims that follow.

What is claimed is:

1. A method for testing an SOPC having a plurality of modules internal thereto to determine whether predetermined performance specifications for the module are satisfied, comprising the steps of:

selecting a first module of the SOPC for test; and determining whether the first module is directly accessible or not, wherein if the first module is directly accessible, the method further comprises stimulating selected pins of the SOPC with one or more test stimuli so as to produce an implicit test signature and determining said test signature with automated test equipment external to the SOPC, and wherein, if the first module is not directly accessible, the method further comprises stimulating the first module with a second module of the SOPC and determining said test signature with a third module of the SOPC.

2. The method of claim 1, wherein said first and second modules are different modules.

3. An SOPC having a plurality of modules internal thereto for determining whether predetermined performance specifications for a selected one of the modules are satisfied, comprising:

a first one of the modules for applying one or more test stimuli to the selected module so as to cause the selected module to produce an implicit test signature; and a second one of the modules for determining said test signature.

4. The SOPC of claim 3, wherein said first and second modules are different modules.

5. A medium readable by a machine embodying a program of instructions executable by the machine to perform a method for testing an SOPC having a plurality of modules internal thereto to determine whether predetermined performance specifications for a selected one of the modules are satisfied, said method for testing comprising the steps of:

determining whether the first module is directly accessible or not, wherein if the first module is directly accessible, the method further comprises stimulating selected pins of the SOPC with one or more test stimuli so as to produce an implicit test signature and determining said test signature with automated test equipment external to the SOPC, and wherein, if the first module is not directly accessible, the method further comprises stimulating the first module with a second module of the SOPC and determining said test signature with a third module of the SOPC.

* * * * *